(12) United States Patent
Akkaya et al.

(10) Patent No.: US 11,152,917 B1
(45) Date of Patent: Oct. 19, 2021

(54) MULTI-LEVEL BUFFERS FOR BIASING OF RADIO FREQUENCY SWITCHES

(71) Applicant: Analog Devices International Unlimited Company, County Limerick (IE)

(72) Inventors: Mehmet A. Akkaya, Istanbul (TR); Atilim Ergul, Istanbul (TR)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/949,056

(22) Filed: Oct. 12, 2020

Related U.S. Application Data

(60) Provisional application No. 62/704,795, filed on May 28, 2020.

(51) Int. Cl.
*H03K 3/012* (2006.01)
*H03K 17/042* (2006.01)
*H03K 17/693* (2006.01)
*H04B 1/44* (2006.01)

(52) U.S. Cl.
CPC ....... *H03K 3/012* (2013.01); *H03K 17/04206* (2013.01); *H03K 17/693* (2013.01); *H04B 1/44* (2013.01)

(58) Field of Classification Search
CPC ............. H03K 3/012; H03K 17/04206; H03K 17/693; H03K 17/687; H04B 1/44
See application file for complete search history.

(56) References Cited

U.S. PATENT DOCUMENTS

| | | | |
|---|---|---|---|
| 5,355,036 | A | 10/1994 | Gata |
| 5,541,600 | A | 7/1996 | Blumenkrantz et al. |
| 5,798,959 | A | 8/1998 | Onetti et al. |
| 6,642,578 | B1 | 11/2003 | Arnold et al. |
| 6,650,168 | B1 | 11/2003 | Wang et al. |
| 7,123,884 | B2 | 10/2006 | Nakakubo et al. |
| 7,579,634 | B2 | 8/2009 | Onodera et al. |
| 7,613,442 | B1 | 11/2009 | Kelly et al. |
| 8,415,991 | B2 | 4/2013 | Rangarajan et al. |
| 8,547,157 | B1 | 10/2013 | Mangold et al. |
| 8,583,111 | B2 | 11/2013 | Burgener et al. |
| 8,649,741 | B2 | 2/2014 | Ijima |
| 8,710,899 | B2 | 4/2014 | George |

(Continued)

FOREIGN PATENT DOCUMENTS

| | | |
|---|---|---|
| CN | 103731119 A | 4/2014 |
| CN | 105487086 A | 4/2016 |

(Continued)

*Primary Examiner* — Jung Kim
(74) *Attorney, Agent, or Firm* — Knobbe, Martens, Olson & Bear, LLP

(57) ABSTRACT

Multi-level buffers for biasing of radio frequency (RF) switches are provided. An RF switching circuit that includes a field-effect transistor (FET) switch, an impedance, and a multi-level buffer that provides a switch control voltage to a gate of the FET through the impedance is disclosed. The multi-level buffer receives a control signal to turn on or off the FET switch. Additionally, the multi-level buffer is implemented with stacked inverters that operate using different clock signal phases to pulse the switch control voltage in response to a transition of the control signal to thereby shorten a delay in switching the FET switch.

20 Claims, 12 Drawing Sheets

(56) References Cited

U.S. PATENT DOCUMENTS

| | | | |
|---|---|---|---|
| 8,963,618 B2 | 2/2015 | Keane et al. | |
| 9,030,248 B2 * | 5/2015 | Kim | H03K 19/00369 |
| | | | 327/333 |
| 9,048,739 B2 | 6/2015 | Shoji et al. | |
| 9,124,353 B2 | 9/2015 | Kang et al. | |
| 9,374,124 B2 | 6/2016 | Kolcuoglu et al. | |
| 9,379,698 B2 | 6/2016 | Nohra | |
| 9,525,413 B2 | 12/2016 | Roberts et al. | |
| 9,548,722 B2 | 1/2017 | Atesal et al. | |
| 9,667,244 B1 | 5/2017 | Cavus et al. | |
| 9,667,255 B2 | 5/2017 | Englekirk | |
| 9,712,158 B1 | 7/2017 | Cavus et al. | |
| 9,722,601 B2 | 8/2017 | Niikura et al. | |
| 10,505,579 B2 | 12/2019 | Jo et al. | |
| 10,778,206 B2 * | 9/2020 | Kolcuoglu | H04B 1/44 |
| 2006/0128334 A1 | 6/2006 | Ikuta et al. | |
| 2007/0013432 A1 | 1/2007 | Miyazawa | |
| 2010/0066427 A1 | 3/2010 | George | |
| 2011/0260774 A1 | 10/2011 | Granger-Jones et al. | |
| 2014/0002214 A1 | 1/2014 | Bawell et al. | |
| 2015/0244051 A1 | 8/2015 | Domino | |
| 2015/0288359 A1 | 10/2015 | Bakalski et al. | |
| 2016/0248400 A1 | 8/2016 | Walker | |
| 2017/0272066 A1 | 9/2017 | Scott et al. | |
| 2019/0149142 A1 | 5/2019 | Scott et al. | |

FOREIGN PATENT DOCUMENTS

| | | | |
|---|---|---|---|
| EP | 0 753 940 A1 | 1/1997 | |
| GB | 2 415 844 | 1/2006 | |
| JP | H05 95239 A | 4/1993 | |
| JP | 2002/064974 | 2/2002 | |
| JP | 2002/064975 | 2/2002 | |
| WO | WO 2012/015849 A1 | 2/2012 | |

* cited by examiner

| ∅₁' | ∅₂ | ∅₃ | ∅₄ | ∅₅' | ∅₆ | OUT |
|---|---|---|---|---|---|---|
| $V_{DD}$ | GND | $V_{DD}$ | GND | $-V_{DD}$ | GND | $2*V_{DD}$ |
| $2*V_{DD}$ | $V_{DD}$ | GND | GND | $-V_{DD}$ | GND | $V_{DD}$ |
| $2*V_{DD}$ | $V_{DD}$ | $V_{DD}$ | GND | $-V_{DD}$ | $V_{DD}$ | GND |
| $2*V_{DD}$ | $V_{DD}$ | $V_{DD}$ | $V_{DD}$ | GND | GND | $-V_{DD}$ |

US 11,152,917 B1

MULTI-LEVEL BUFFERS FOR BIASING OF RADIO FREQUENCY SWITCHES

CROSS-REFERENCE TO RELATED APPLICATIONS

The present application claims priority to U.S. Provisional Patent Application No. 62/704,795, filed May 28, 2020, and titled "MULTI-LEVEL BUFFERS FOR BIASING OF RADIO FREQUENCY SWITCHES," the entirety of which is hereby incorporated herein by reference.

FIELD OF THE DISCLOSURE

Embodiments of the invention relate to electronic systems, and more particularly, to biasing of radio frequency switches.

BACKGROUND

A radio frequency (RF) communication system can include RF switches used for a variety of purposes.

In one example, an RF communication system can include an antenna switch module (ASM) implemented using RF switches. Additionally, the antenna switch module can be used to electrically connect an antenna to a particular transmit or receive path of the system, thereby allowing multiple components to access the antenna. In another example, an RF communication system can include a digital step attenuator (DSA), and the DSA can include RF switches that are turned on or off to control an amount of attenuation provided by the DSA.

SUMMARY OF THE DISCLOSURE

Multi-level buffers for biasing of radio frequency (RF) switches are provided. In certain embodiments, an RF switching circuit includes a field-effect transistor (FET) switch, an impedance, and a multi-level buffer that provides a switch control voltage to a gate of the FET through the impedance. The multi-level buffer receives a control signal to turn on or off the FET switch. Additionally, the multi-level buffer is implemented with stacked inverters that operate using different clock signal phases to pulse the switch control voltage in response to a transition of the control signal to thereby shorten a delay in switching the FET switch. By stacking inverters that operate using different clock signal phases, transistor junction voltages are controlled in a manner that maximum gate-to-source voltages, maximum gate-to-drain voltages, and/or maximum drain-to-source voltages are not exceeded.

In one aspect, a radio frequency (RF) switching circuit is provided. The RF switching circuit includes a field-effect transistor (FET) switch including a gate, an impedance, and a multi-level buffer having an output terminal connected to the gate of the FET through the impedance. The multi-level buffer includes a first inverter configured to receive a first clock signal phase and powered by a first supply voltage and a second supply voltage less than the first supply voltage, a second inverter configured to receive a second clock signal phase and powered by the second supply voltage and a third supply voltage less than the second supply voltage, a third inverter configured to receive a third clock signal phase and powered by an output of the first inverter and an output of the second inverter, and a first output switch connected between the output terminal and an output of the third inverter.

In another aspect, a multi-level buffer for driving a transistor gate is provided. The multi-level buffer includes an output terminal, a first inverter configured to receive a first clock signal phase and powered by a first supply voltage and a second supply voltage less than the first supply voltage, a second inverter configured to receive a second clock signal phase and powered by the second supply voltage and a third supply voltage less than the second supply voltage, a third inverter configured to receive a third clock signal phase and powered by an output of the first inverter and an output of the second inverter, and a first output switch connected between the output terminal and an output of the third inverter.

In another aspect, a method of radio frequency (RF) switching is provided. The method includes providing a first clock signal phase to an input of a first inverter that is powered by a first supply voltage and a second supply voltage less than the first supply voltage, providing a second clock signal phase to an input of a second inverter that is powered by the second supply voltage and a third supply voltage less than the second supply voltage, providing a third clock signal phase to an input of a third inverter that is powered by an output of the first inverter and an output of the second inverter, controlling an output voltage at an output terminal using a first output switch connected between the output terminal and an output of the third inverter, and providing the output voltage to a gate of a field-effect transistor (FET) switch through an impedance.

DETAILED DESCRIPTION OF EMBODIMENTS

Figure 1:
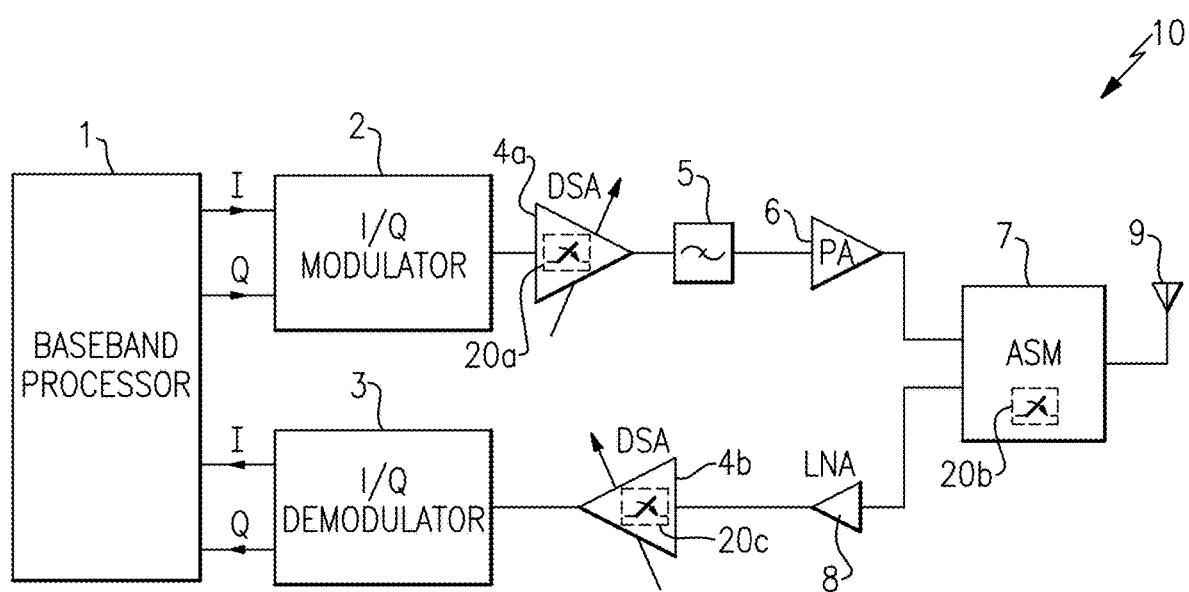
FIG. 1 is a schematic diagram of one example of a radio frequency (RF) system that can include one or more RF switching circuits in accordance with the teachings herein.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A radio frequency (RF) communication system communicates by wirelessly transmitting and receiving RF signals. Such RF communication systems can include one or more RF switches to provide control over routing of RF signals, connectivity between components or circuits, and/or to provide various other switching functions. Examples of RF communication systems with one or more RF switches include, but are not limited to, base stations, mobile devices (for instance, smartphones or handsets), laptop computers, tablets, Internet of Things (IoT) devices, and/or wearable electronics.

Certain RF switching circuits include a field-effect transistor (FET) switch and a switch bias circuit that controls a gate voltage of the switch to thereby change a channel impedance of the switch and modulate the switch's conductivity. For example, the switch bias circuit can control the gate voltage to a first level to turn off the FET switch such that the channel impedance is high and the RF signal does not pass through the FET switch. Additionally, the switch bias circuit can control the gate voltage to a second level to turn on the FET switch such that the channel impedance is low and the RF signal passes through the FET switch. Thus, the switch bias circuit is used to turn the FET switch on or off to control passage of the RF signal.

An RF signal can couple onto the gate of the FET switch via a parasitic gate-to-drain capacitance (Cgd) and/or a parasitic gate-to-source capacitance (Cgs) of the FET switch. To provide isolation, a gate resistor can be included between an output of the switch bias circuit and the gate of the FET switch.

Several benefits are provided by a large resistance value of the gate resistor, such as low loss and/or low cutoff frequency to provide wideband operation. However, making the resistance value of the gate resistor large also undesirably lengthens the turn-on time and turn-off time of the FET switch. For example, when the switch bias circuit changes the gate voltage of the FET switch, there is an undesirable switching delay based on a resistor-capacitor (RC) time constant arising from a resistance of the gate resistor and a gate capacitance of the FET switch. The delay in switching leads to an increase in turn-on time and turn-off time of the switch.

Thus, although implementing the gate resistor with a high resistance provides a number of benefits, it also degrades the switching performance of the FET switch.

To achieve short switching time, an RF system can include an RF switch having a control input that controls an impedance of the RF switch, a multi-level buffer configured to receive a control signal for selectively activating the RF switch, and a resistor electrically connected between an output of the multi-level buffer and the control input to the RF switch. Additionally, the multi-level buffer generates a switch control voltage at the output, and pulses the switch control voltage in response to a transition of the control signal to thereby shorten a delay in switching the RF switch.

Thus, rather than directly transitioning the switch control voltage from an ON voltage to an OFF voltage, or vice versa, the switch control voltage is pulsed before being controlled to a steady-state voltage level. By pulsing the switch control voltage in this manner, charging or discharging at the control input of RF switch occurs faster, which shortens the switching delay of the RF switch.

Embodiments, of multi-level buffers for driving RF switches are provided herein.

In certain implementations, the multi-level buffer controls the RF switch not only with a steady-state switch ON voltage (for instance, a power high supply voltage) and a steady-state switch OFF voltage (for instance, a power low supply voltage or ground voltage), but also with a high voltage greater than the steady-state switch ON voltage and a low voltage lower than the steady-state switch OFF voltage.

For example, when turning on an n-type field-effect transistor (NFET) switch, the multi-level buffer uses the high voltage to control the gate voltage of the NFET switch for a portion of time, and thereafter controls the gate voltage with the steady-state switch ON voltage. Additionally, when turning off the NFET switch, the multi-level buffer uses the low voltage to control the gate voltage of the NFET switch for a portion of time, and thereafter controls the gate voltage with the steady-state switch OFF voltage. The result is a speed-up of the turn-on and turn-off times of the NFET switch.

In certain implementations, the voltage level of the pulse is beyond a breakdown voltage at which the switch can reliably operate, for example, in excess of a maximum gate-to-source voltage for FET switches. Thus, the pulse voltage level would damage the switch due to reliability considerations if used to control the switch in the steady-state. However, by applying the pulse via the resistor or other impedance, the voltage directly at the control input of the switch remains within a voltage range for reliable operation. Thus, the benefits of fast switching time are achieved without damaging the switch.

In certain implementations, the multi-level buffer is also implemented using standard voltage FETs that cannot reliably handle the full voltage of the pulse. However, by stacking inverters that operate using different clock signal phases, junction voltages of the FETs are controlled in a manner that maximum gate-to-source voltages, maximum gate-to-drain voltages, and/or maximum drain-to-source voltages are not exceeded. Thus, the multi-level buffer operates within reliability specifications while using standard voltage FETs, thereby avoiding a need for the cost and/or complexity of a fabrication process providing high voltage tolerant transistors.

Pulsing the switch control voltage provides an enhancement to switching speed with little to no impact on other performance characteristics of the RF switch, such as linearity, power handling capability, and/or insertion loss. For example, the switch control voltage can be pulsed without needing to include additional circuitry along the RF signal path through the switch or at the control input of the RF switch. Thus, the switching speed is improved without needing to add circuitry such as resistor bypass switches that could degrade performance by parasitically loading the RF switch.

FIG. 1 is a schematic diagram of one example of an RF communication system 10 that can include one or more RF switching circuits in accordance with the teachings herein.

Although, the RF communication system 10 illustrates one example of an electronic system that can include one or more RF switching circuits, the RF switching circuits described herein can be used in other configurations of electronic systems.

Furthermore, although a particular configuration of components is illustrated in FIG. 1, the RF communication system 10 can be adapted and modified in a wide variety of ways. For example, the RF communication system 10 can include more or fewer receive paths and/or transmit paths. Additionally, the RF communication system 10 can be modified to include more or fewer components and/or a different arrangement of components, including, for example, a different arrangement of RF switching circuits.

In the illustrated configuration, the RF communication system 10 includes a baseband processor 1, an I/Q modulator 2, an I/Q demodulator 3, a first digital step attenuator 4a, a second digital step attenuator 4b, a filter 5, a power amplifier 6, an antenna switch module 7, a low noise amplifier 8, and an antenna 9.

As shown in FIG. 1, baseband processor 1 generates an in-phase (I) transit signal and a quadrature-phase (Q) transmit signal, which are provided to the I/Q modulator 2. Additionally, the baseband processor 1 receives an I receive signal and a Q receive signal from the I/Q demodulator 3. The I and Q transmit signals correspond to signal components of a transmit signal of a particular amplitude, frequency, and phase. For example, the I transmit signal and Q transmit signal represent an in-phase sinusoidal component and quadrature-phase sinusoidal component, respectively, and can be an equivalent representation of the transmit signal. Additionally, the I and Q receive signals correspond to signal components of a receive signal of a particular amplitude, frequency, and phase.

In certain implementations, the I transmit signal, the Q transmit signal, the I receive signal, and the Q receive signal are digital signals. Additionally, the baseband processor 1 can include a digital signal processor, a microprocessor, or a combination thereof, used for processing the digital signals.

The I/Q modulator 2 receives the I and Q transmit signals from the baseband processor 1 and processes them to generate a modulated RF signal. In certain configurations, the I/Q modulator 2 can include DACs configured to convert the I and Q transmit signals into an analog format, mixers for upconverting the I and Q transit signals to radio frequency, and a signal combiner for combining the upconverted I and Q signals into the modulated RF signal.

The first digital step attenuator 4a receives the modulated RF signal, and attenuates the modulated RF signal to generate an attenuated RF signal. The first digital step attenuator 4a can aid in obtaining a desired gain and/or power level associated with transmission. In the illustrated configuration, the first digital step attenuator 4a includes a first RF switching circuit 20a. The first digital step attenuator 4a illustrates one example of a circuit that can include one or more RF switching circuits in accordance with the teachings herein. For example, the first digital step attenuator 4a can include a cascade of attenuator stages, each of which can be bypassed using an RF switching circuit to aid in providing a digitally adjustable amount of attenuation.

The filter 5 receives the attenuated RF signal from the first digital step attenuator 4a, and provides a filtered RF signal to an input of the power amplifier 6. In certain configurations, the filter 5 can be a band pass filter configured to provide band filtering. However, the filter 5 can be a low pass filter, a band pass filter, a notch filter, a high pass filter, or a combination thereof, depending on the application.

The power amplifier 6 can amplify the filtered RF signal to generate an amplified RF signal, which is provided to the antenna switch module 7. The antenna switch module 7 is further electrically connected to the antenna 9 and to an input of the low noise amplifier 8. The antenna switch module 7 can be used to selectively connect the antenna 9 to the output of the power amplifier 6 or to the input of the low noise amplifier 8. In certain implementations, the antenna switch module 7 can provide a number of other functionalities, including, but not limited to, band switching, switching between transmit and receive, and/or switching between different power modes.

In the illustrated configuration, the antenna switch module 7 includes a second RF switching circuit 20b. The antenna switch module 7 illustrates another example of a circuit that can include one or more RF switching circuits in accordance with the teachings here. For example, the antenna switch module 7 can include an RF switching circuit implemented as a single pole multi-throw switch. Although FIG. 1 illustrates a configuration in which the antenna switch module 7 operates as a single pole double throw switch, the antenna switch module 7 can be adapted to include additional poles and/or throws.

The LNA 8 receives an antenna receive signal from the antenna switch module 7, and generates an amplified antenna receive signal that is provided to the second digital step attenuator 4b. The second digital step attenuator 4b can attenuate the amplified antenna receive signal by a digitally-controllable amount of attenuation. As shown in FIG. 1, the second digital step attenuator 4b generates an attenuated receive signal, which is provided to the I/Q demodulator 3. Including the second digital step attenuator 4b can aid in providing the I/Q demodulator 3 with a signal that has a desired amplitude and/or power level. In the illustrated configuration, the second digital step attenuator 4b includes a third RF switching circuit 20c. The second digital step attenuator 4b illustrates another example of a circuit that can include one or more RF switching circuits in accordance with the teachings herein.

The I/Q demodulator 3 can be used to generate the I receive signal and the Q receive signal, as was descried earlier. In certain configurations, the I/Q demodulator 3 can include a pair of mixers for mixing the attenuated receive signal with a pair of clock signals that are about ninety degrees out of phase. Additionally, the mixers can generate downconverted signals, which can be provided to ADCs used to generate the I and Q receive signals.

The RF switching circuits 20a-20c can be used for handling RF signals using a variety of communication standards, including, for example, Global System for Mobile Communications (GSM), Code Division Multiple Access (CDMA), wideband CDMA (W-CDMA), Long Term Evolution (LTE), Enhanced Data Rates for GSM Evolution (EDGE), 3G, 4G, and/or 5G, as well as other proprietary and non-proprietary communications standards.

Moreover, the RF switching circuits 20a-20c can control switching of signals of a variety of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

Providing an RF switch in a transmit or receive path of an RF communication system can impact the system's performance. For example, not only can the RF switch's linearity, power handling capability, and insertion loss impact operations of the system, but also transient performance characteristics such as turn-on time, turn-off time, and/or settling time can provide a performance impact. The teachings herein can be used improve transient performance characteristics of an RF switch, with little to no impact on other performance characteristics of the RF switch, such as linearity, power handling capability, and/or insertion loss.

Figure 2A:
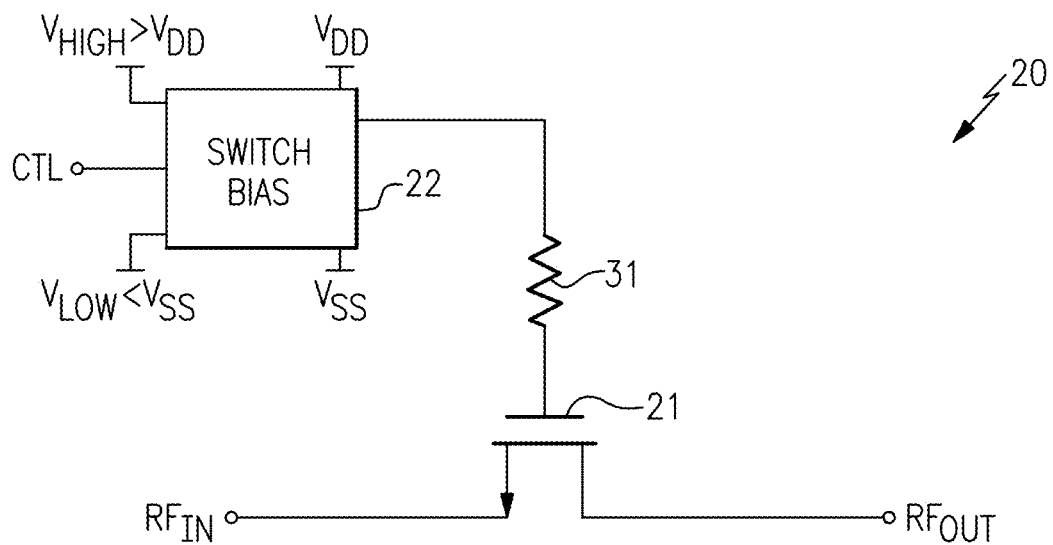
FIG. 2A is a circuit diagram of an RF switching circuit according to one embodiment.

FIG. 2A is a circuit diagram of an RF switching circuit 20 according to one embodiment. The RF switching circuit 20 includes an n-type field effect transistor (NFET) switch 21, a multi-level buffer 22 (also referred to herein as a switch bias circuit), and a gate bias resistor 31.

As shown in FIG. 2A, the multi-level buffer 22 receives a control signal CTL for indicating whether the NFET switch 21 should be turned on or turned off by the multi-level buffer 22. Thus, the control signal CTL is used to selectively activate the NFET switch 21. The multi-level buffer 22 also receives a power high supply voltage $V_{DD}$, a ground or power low supply voltage $V_{SS}$, a high voltage $V_{HIGH}$ greater than the power high supply voltage $V_{DD}$, and a low voltage $V_{LOW}$ lower than the power low supply voltage $V_{SS}$.

Although FIG. 2A illustrates a configuration in which the multi-level buffer 22 is used to control one FET switch, the multi-level buffer 22 can be configured to bias one or more additional FET switches. In such configurations, the multi-level buffer 22 can include additional switch control inputs, such as a control signal associated with each FET switch. However, other configurations are possible, such as implementations in which a control signal is used to control multiple FET switches. For example, in certain implementations, a multi-level buffer is used to control a series FET switch as well as a shunt FET switch. Additionally, the series FET switch and the shunt FET switch can controlled by a common control signal such that when the series FET switch is turned on the shunt FET switch is turned off, and vice versa.

In the illustrated configuration, a source of the NFET switch 21 is electrically connected to the RF input $RF_{IN}$, and a drain of the NFET switch 21 is electrically connected to the RF output $RF_{OUT}$. Although an example in which an RF switch is connected between an RF input terminal and an RF output terminal, other configurations are possible, such as implementations in which the RF switch is connected between a first RF terminal and a second RF terminal that are bidirectional.

As shown in FIG. 2A, the gate bias resistor 31 is electrically connected between a gate bias output of the multi-level buffer 22 and a gate of the NFET switch 21. The gate bias resistor 31 can enhance isolation between the gate bias output of the multi-level buffer 22 and the gate of the NFET switch 21. For example, high frequency signal components can be coupled onto the gate of the NFET switch 21 via parasitic gain-to-drain and/or gate-to-source capacitances, and the gate bias resistor 31 can provide resistance that impedes the high frequency signal components from reaching the gate bias output of the multi-level buffer 22.

Although FIG. 2A illustrates the output of the multi-level buffer 22 being connected to the gate of the NFET switch 21 via the resistor 31, any suitable impedance can be connected between the output of the multi-level buffer 22 and the gate of the NFET switch 21. For example, in another embodiment, an inductor or a combination of an inductor and a resistor are connected between the output of a multi-level buffer and a control input to an RF switch.

The NFET switch 21 can be implemented in a variety of ways. In one embodiment, the NFET switch 21 is implemented as a silicon-on-insulator (SOI) metal oxide semiconductor (MOS) transistor including a body that is electrically floating. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

Although FIG. 2A illustrates a configuration using n-type transistors, the teachings herein are applicable to configurations using p-type transistors or a combination of n-type and p-type transistors. Furthermore, the teachings herein are applicable to other types of RF switches that include a control input for controlling the RF switch's impedance.

The RF switching circuit 20 can be used in a wide variety of configurations within an electronic system. For example, the NFET switch 21 can operate in a transmit signal path or a receive signal path of an RF communication system, such as the RF communication system 10 of FIG. 1.

With continuing reference to FIG. 2A, the multi-level buffer 22 receives the control signal CTL for selectively activating the NFET switch 21. In particular, the control signal CTL indicates whether the multi-level buffer 22 should turn on the NFET switch 21 or turn off the NFET switch 21.

The multi-level buffer 22 generates a switch control voltage at the gate bias output, and pulses the switch control voltage in response to a transition of the control signal CTL to thereby shorten a delay in switching the NFET switch 21.

Thus, rather than directly transitioning the switch control voltage from an ON voltage to an OFF voltage, or vice versa, the switch control voltage is temporarily pulsed before being controlled to a steady-state voltage level. By pulsing the switch control voltage in this manner, the switching delay of the NFET switch 21 is shortened.

The pulsing can be applied when turning on the NFET switch 21 to improve turn-on speed and/or when turning off the NFET switch 21 to improve turn-off speed. Although various embodiments herein provide a pulse for both an ON to OFF transition and for an OFF to ON transition, the teachings herein are also applicable to implementations in which a pulse is only provided for an ON to OFF transition or only provided for an OFF to ON transition. In such implementations, a multi-level buffer can include corresponding circuitry for providing the desired pulse, while omitting other circuitry not needed for providing the desired pulse.

In certain implementations, when switching the NFET switch 21 from an OFF state to an ON state, the multi-level buffer 22 first changes the switch control voltage from a steady-state switch OFF voltage (for instance, $V_{SS}$) to the high voltage $V_{HIGH}$, and then from the high voltage $V_{HIGH}$ to a steady-state switch ON voltage (for instance, $V_{DD}$). Thus, the multi-level buffer 22 pulses the switch control voltage when turning on the NFET switch 21.

By pulsing the switch control voltage in this manner, the turn-on time of the NFET switch 21 is shortened.

In certain implementations, when switching the NFET switch 21 from an ON state to an OFF state, the multi-level buffer 22 first changes the switch control voltage from a steady-state switch ON voltage (for instance, $V_{DD}$) to the low voltage $V_{LOW}$, and then from the low voltage $V_{LOW}$ to a steady-state switch OFF voltage (for instance, $V_{SS}$). Thus, the multi-level buffer 22 pulses the switch control voltage when turning off the NFET switch 21 to thereby shorten turn-off time. The duration of the pulse can be controlled in a wide variety of ways, including by logic circuitry configured to generate clock signal phases for timing the multi-level buffer 22 based on delaying an edge of the control single CTL.

The high voltage $V_{HIGH}$ and/or the low voltage $V_{LOW}$ can be provided in a wide variety of ways, including, but not limited to, receiving the voltage on a pin or generated using charge pumps or other voltage regulators. Likewise, $V_{DD}$ and/or $V_{SS}$ can be provided in a wide variety of ways, including, but not limited to, receiving the voltage on the pin or generated from other voltages (for instance, from $V_{HIGH}$ and/or $V_{LOW}$).

In certain implementations, at least one of the high voltage $V_{HIGH}$ or the low voltage $V_{LOW}$ is beyond a breakdown voltage for transistor reliability considerations, for example, beyond a maximum or below a minimum gate-to-source voltage permitted by the processing technology used to fabricate the NFET switch 21. Thus, controlling the gate of the NFET switch 21 with the high voltage $V_{HIGH}$ and/or the low voltage $V_{LOW}$ in the steady state would potentially damage the RF switch 21 due to transistor reliability limitations.

However, by applying the pulsed switch control voltage to an opposite end of the gate resistor 31 as the end connected to the gate of the NFET switch 21, the voltage directly at the gate remains within a range of voltages acceptable for reliable operation of the NFET switch 21. Thus, the benefits of fast switching time are achieved while operating within voltage constraints or limitations of the NFET switch 21.

Figure 2B:
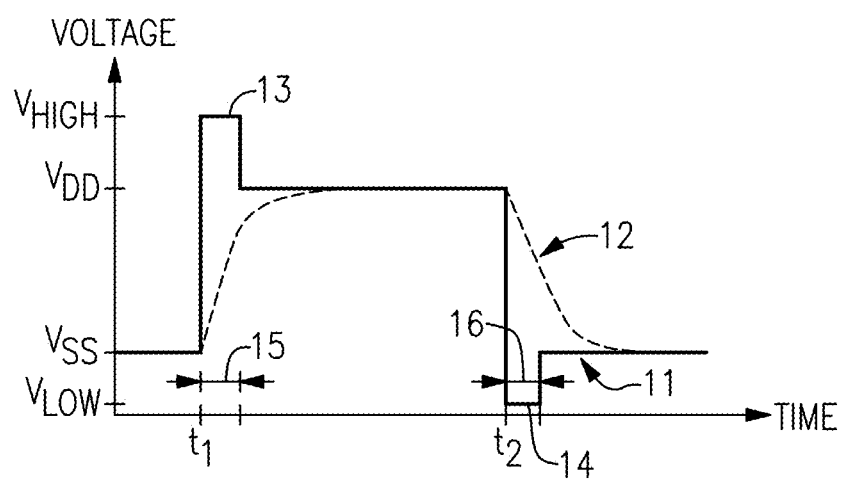
FIG. 2B is one example of a timing diagram for the RF switching circuit of FIG. 2A.

FIG. 2B is one example of a timing diagram for the RF switching circuit 20 of FIG. 2A. The timing diagram includes a first plot 11 of switch control voltage outputted by the multi-level buffer 22 versus time, and a second plot 12 of gate voltage of the NFET switch 21 versus time. The timing diagram includes a first time $t_1$ at which the control signal CTL transitions to turn the NFET switch 21 from an OFF state to an ON state, and a second time $t_2$ at which the control signal CTL transitions to turn the NFET switch 21 from the ON state to the OFF state.

As shown in FIG. 2B, the multi-level buffer 22 pulses the switch control voltage when turning on the switch as well as when turning off the switch, in this embodiment. For example, when the NFET switch 21 is turned on at time $t_1$, the multi-level buffer 22 generates a turn-on pulse 13 associated with first transitioning the switch control voltage from $V_{SS}$ to $V_{HIGH}$, and thereafter from $V_{HIGH}$ to $V_{DD}$. Additionally, when the NFET switch 21 is turned off at time $t_2$, the multi-level buffer 22 generates a turn-off pulse 14 associated with first transitioning the switch control voltage from $V_{DD}$ to $V_{LOW}$, and thereafter from $V_{LOW}$ to $V_{SS}$.

The duration 15 of the turn-on pulse 13 and the duration 16 of the turn-off pulse 14 can be controlled in a wide variety of ways. In a first example, the multi-level buffer 22 includes logic circuitry that performs logical operations on an input control signal and delayed versions thereof to generate clock signal phases that set the duration 15 and the duration 16.

As shown in FIG. 2B, the turn-on pulse 13 and the turn-off pulse 14 have opposite polarity. For example, the turn-on pulse 13 has increased voltage level before settling to a lower voltage level, while the turn-off pulse 14 has decreased voltage level before settling to a higher voltage level. In certain implementations, a multi-level buffer generates a first pulse in response to an ON to OFF transition of an RF switch, and generates a second pulse in response to an OFF to ON transition of the RF switch, and the first and second pulse have opposite polarity.

Figure 2C:
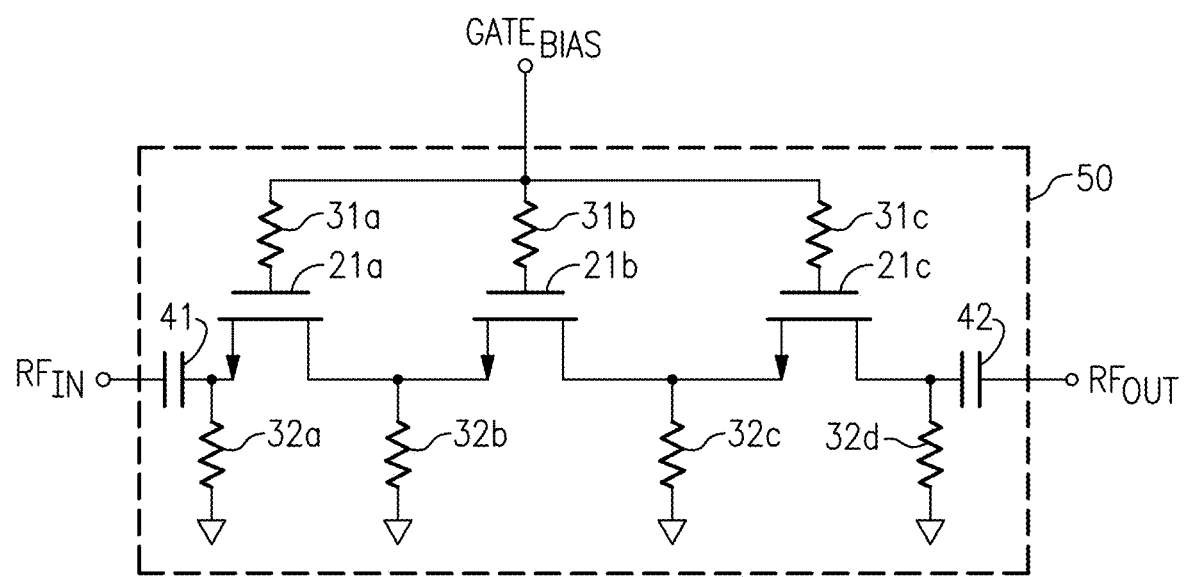
FIG. 2C is another example of an RF switch for use in an RF switching circuit.

FIG. 2C is another example of an RF switch 50 for use in an RF switching circuit.

The RF switch 50 includes a first NFET switch 21a, a second NFET switch 21b, a third NFET switch 21c, a first gate bias resistor 31a, a second gate bias resistor 31b, a third gate bias resistor 31c, a first channel biasing resistor 32a, a second channel biasing resistor 32b, a third channel biasing resistor 32c, a fourth channel biasing resistor 32d, a first DC blocking capacitor 41, and a second DC blocking capacitor 42. Although one embodiment of an RF switch is shown in FIG. 2C, the teachings herein are applicable to RF switches implemented in a wide variety of ways.

In the illustrated embodiment, the first NFET switch 21a, the second NFET switch 21b, and the third NFET switch 21c are in series with one another. Including multiple FET switch components in series can increase a power handling capability of an RF switch. Although an example with three FET switches in series is shown, more or fewer FET switches can be included to achieve desired performance characteristics. As shown in FIG. 2C, the gate bias resistors 31a-31c are electrically connected between a gate bias terminal $GATE_{BIAS}$ (which is driven by a multi-level buffer) and the gates of the NFET switches 21a-21c, respectively.

The channel biasing resistors 32a-32d collectively operate to control a bias voltage of the sources and drains of the NFET switches 21a-21c, thereby helping to control gate-to-source and gate-to-drain biasing characteristics of the transistors. Although one example of channel biasing is shown, other implementations of channel biasing are possible, including, but not limited to, implementations using resistors in parallel with the channels of one or more NFET switches.

The first DC blocking capacitor 41 and second DC blocking capacitor 42 provide DC blocking to allow the sources and drains of the NFET switches 21a-21c to operate at a different DC voltage levels than the RF input $RF_{IN}$ and the RF output $RF_{OUT}$. However, the teachings herein are also applicable to RF switches that operate without DC blocking capacitors.

Although one example of an RF switch with NFETs switches is shown, RF switches can also be implemented using p-type FET (PFET) switches or a combination of NFET switches and PFET switches.

Figure 3A:
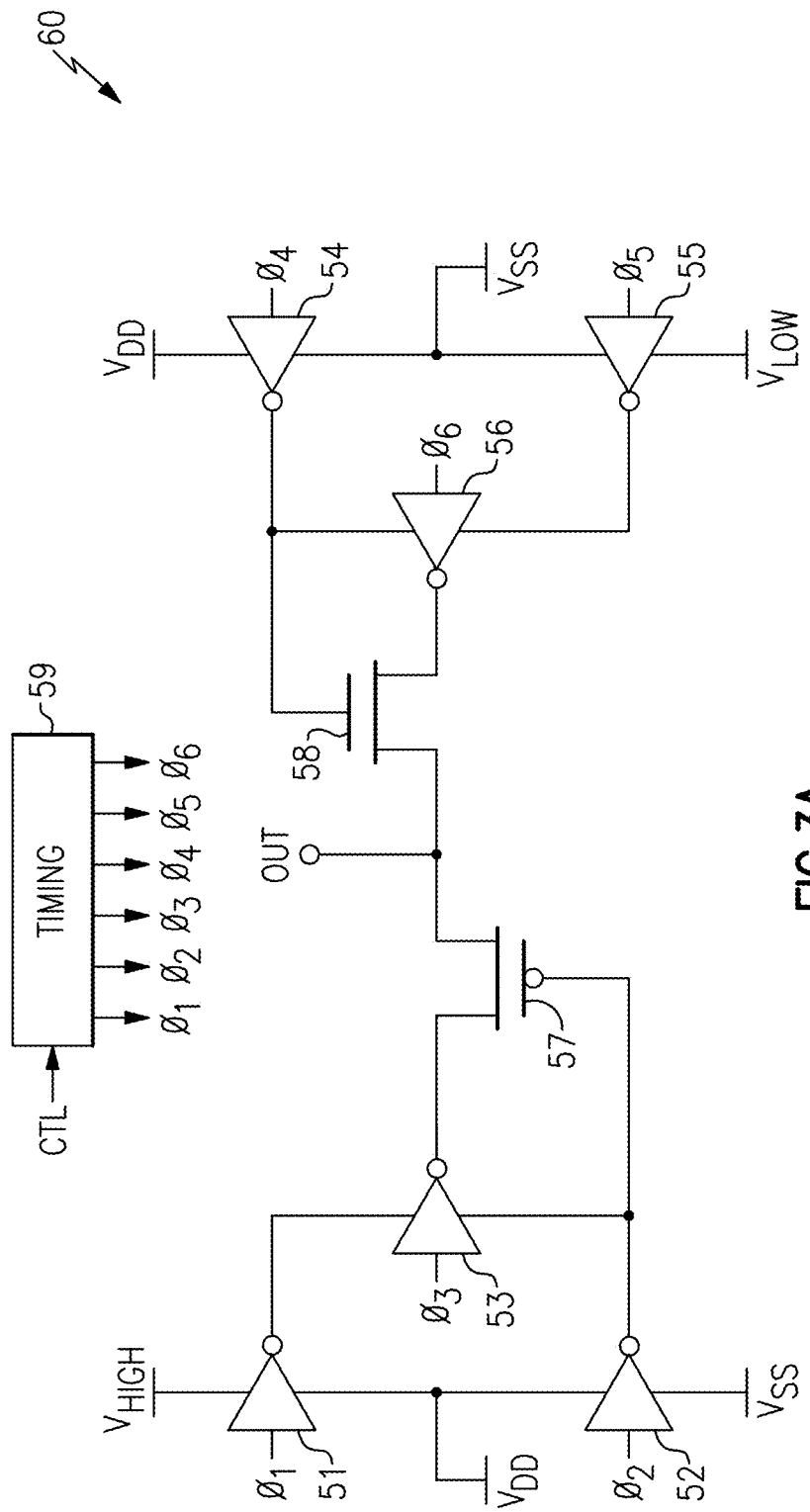
FIG. 3A is a schematic diagram of one embodiment of a multi-level buffer for driving an RF switch.

FIG. 3A is a schematic diagram of one embodiment of a multi-level buffer 60 for driving an RF switch. The multi-level buffer 60 operates on power supplies $V_{HIGH}$, $V_{DD}$, $V_{SS}$, and $V_{LOW}$, with $V_{HIGH}>V_{DD}>V_{SS}>V_{LOW}$ (for example, as shown in FIG. 2B). The multi-level buffer 60 receives a control signal CTL and includes an output terminal OUT for driving a control input of an RF switch (for instance, a gate bias terminal) through an impedance (for instance, a gate resistor).

In the illustrated embodiment, the multi-level buffer 60 incudes a first inverter 51 controlled by a first clock signal phase $\varphi_1$, a second inverter 52 controlled by a second clock signal phase $\varphi_2$, a third inverter 53 controlled by a third clock signal phase $\varphi_3$, a fourth inverter 54 controlled by a fourth clock signal phase $\varphi_4$, a fifth inverter 55 controlled by a fifth clock signal phase $\varphi_5$, a sixth inverter 56 controlled by a sixth clock signal phase $\varphi_6$, a first output switch (implemented as a PFET 57, in this example), a second output switch (implemented as an NFET 58, in this example), and a timing circuit 59.

As shown in FIG. 3A, the first inverter 51 is powered by $V_{HIGH}$ and $V_{DD}$, while the second inverter 52 is powered by $V_{DD}$ and $V_{SS}$. Thus, the first inverter 51 and the second inverter 52 are electrically stacked between the $V_{HIGH}$ and $V_{SS}$ power supplies. Additionally, the third inverter 53 is powered by an output of the first inverter 51 and an output of the second inverter 52. The output of the third inverter 53 is connected to the output terminal OUT by way of a channel of the PFET 57, while the output of the second inverter 52 controls a gate of the PFET 57.

With continuing reference to FIG. 3A, the fourth inverter 54 is powered by powered by $V_{DD}$ and $V_{SS}$, while the fifth inverter 55 is powered by $V_{SS}$ and $V_{LOW}$. Thus, the fourth inverter 54 and the fifth inverter 55 are electrically stacked between the $V_{DD}$ and $V_{LOW}$ power supplies. Additionally, the sixth inverter 56 is powered by an output of the fourth inverter 54 and an output of the fifth inverter 55. The output of the sixth inverter 56 is connected to the output terminal OUT by way of a channel of the NFET 58, while the output of the fourth inverter 54 controls a gate of the NFET 58.

In the illustrated embodiment, the first through sixth clock signal phases $\varphi_1$-$\varphi_6$ are generated by the timing circuit 59, which receives the control signal CTL. In certain implementations, an edge of the control signal CTL is delayed within the timing circuit 59, and the timing circuit 59 performs logical operations on the control signal CTL and/or delayed versions thereof to generate the clock signal phases. Implementing the timing circuit 59 in this manner avoids a need for an oscillator, which can generate noise at the oscillation frequency that can interfere with operation of RF signaling. However, other implementations of timing circuits are possible.

Figure 3B:
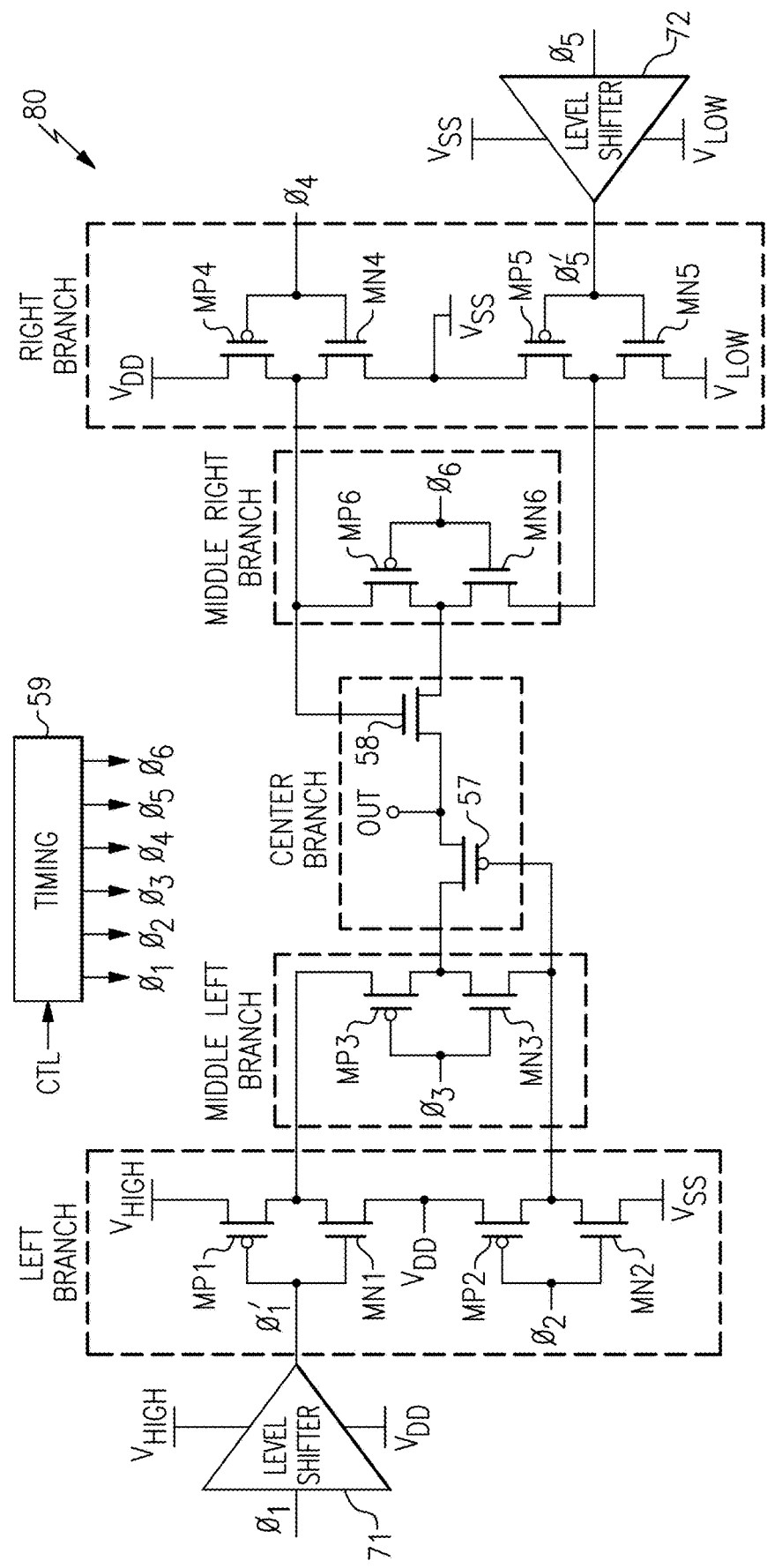
FIG. 3B is a schematic diagram of another embodiment of a multi-level buffer for driving an RF switch.

FIG. 3B is a schematic diagram of another embodiment of a multi-level buffer 80 for driving an RF switch. The multi-level buffer 80 of FIG. 3B includes a similar configuration of a timing circuit 59, PFET output switch 57, NFET output switch 58, and inverters as the multi-level buffer 60 of FIG. 3A, except that in FIG. 3B each inverter is specifically implemented using a PFET and an NFET connected as a CMOS inverter.

For example, the first inverter includes a first PFET MP1 and a first NFET MN1, while the second inverter incudes a second PFET MP2 and a second NFET MN2. Additionally, the third inverter includes a third PFET MP3 and a third NFET MN3, while the fourth inverter includes a fourth PFET MP4 and a fourth NFET MN4. Furthermore, the fifth inverter includes a fifth PFET MP5 and a fifth NFET MN5, while the sixth inverter includes a sixth PFET MP6 and a sixth NFET MN6.

Additionally, the multi-level buffer 80 of FIG. 3B further includes a first level-shifter 71 for driving the first inverter, and a second level-shifter 72 for driving the fifth inverter. The first level-shifter 71 shifts the first clock signal (pi in a voltage domain associated with $V_{DD}$ and $V_{SS}$ to generate clock signal (pi' in a voltage domain associated with $V_{HIGH}$ and $V_{DD}$. Additionally, the second level-shifter 72 shifts the fifth clock signal $\varphi_5$ in a voltage domain associated with $V_{DD}$ and $V_{SS}$ to generate clock signal $\varphi_5$' in a voltage domain associated with $V_{SS}$ and $V_{LOW}$. Any type of level-shifters can be used for providing level shifting.

The left branch includes two stacked inverters, operating between $V_{HIGH}$:$V_{DD}$ and $V_{DD}$:$V_{SS}$, respectively. The left branch is inherently safe in terms of reliability. The upper left inverter defines supply voltage of the middle left branch, while the lower left inverter defines ground voltage of the middle left branch. The upper left branch uses the first level-shifter 71 operating between $V_{HIGH}$ and $V_{DD}$.

The right branch includes two stacked inverters, operating between $V_{DD}$: $V_{SS}$ and $V_{SS}$:$V_{LOW}$ respectively. The right branch is inherently safe in terms of reliability. The upper right inverter defines supply voltage of the middle right branch, while the lower left inverter defines ground voltage of the middle right branch. The lower right branch uses the second level-shifter 72 operating between $V_{SS}$ and $V_{LOW}$.

The center branch is used to isolate one of the left branch or the right branch while generating desired output voltage.

Figures 4A, 4B:
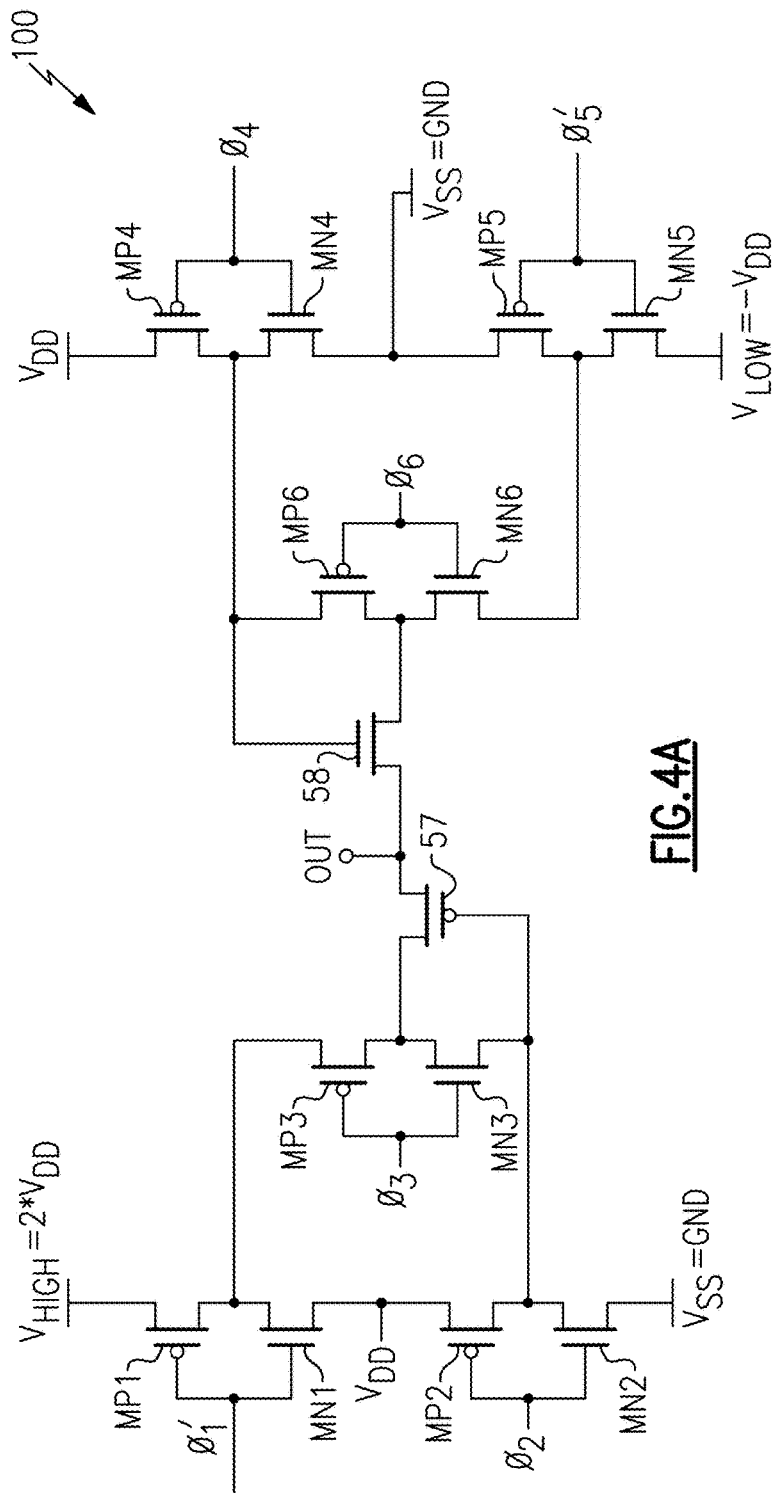
FIG. 4A is a schematic diagram of another embodiment of a multi-level buffer for driving an RF switch.
FIG. 4B is a table describing one example of operation of the multi-level buffer of FIG. 4A.

FIG. 4A is a schematic diagram of another embodiment of a multi-level buffer 100 for driving an RF switch. The multi-level buffer 100 of FIG. 4A includes the PFET output switch 57, the NFET output switch 58, and the six inverters shown for the multi-level buffer 80 of FIG. 4A. Although not depicted, the timing circuit 59 and the level-shifters 71 and 72 of FIG. 3B can be included in the multi-level buffer 100. As shown in FIG. 4A, annotations for specific supply voltage levels ($V_{HIGH}=2*V_{DD}$, $V_{SS}=0V$, and $V_{LOW}=-V_{DD}$) are shown.

FIG. 4B is a table describing one example of operation of the multi-level buffer 80 of FIG. 4A. Clock signal values for achieving each of the four output voltage levels are depicted.

With reference to FIGS. 4A and 4B, the multi-level buffer 100 requires no high voltage transistors and operates without any reliability concerns. Thus, all FETs of the multi-level buffer can be standard voltage transistors rated for $V_{DD}$. Additionally, the multi-level buffer is able to generate four output voltages levels ($2*V_{DD}$ ($V_{HIGH}$), $V_{DD}$, GND ($V_{SS}$), and $-V_{DD}$ ($V_{LOW}$)), with each transistor operating only in $V_{DD}$ range while generating all required voltages (including $2*V_{DD}$, $-V_{DD}$). Furthermore, the multi-level buffer 100 operates with low load current, which is particularly advantageous in applications in which one or more of the supply voltages is generated using a regulator or charge pump.

With continuing reference to FIGS. 4A and 4B, the multi-level buffer has high dynamic range, for instance, operation between $2*V_{DD}$ and $-V_{DD}$ to achieve dynamic range of $3*V_{DD}$. All transistors can be implemented using standard voltage transistors, for instance, standard (3V) NMOS and PMOS devices without any high voltage devices. In this example, the output voltage can be $2*V_{DD}$, $V_{DD}$, 0 or $-V_{DD}$ according to clock phase signals ($\varphi_1$ through $\varphi_6$), and thus the multi-level buffer 100 can operate digitally in certain implementations.

To generate voltage higher than $V_{DD}$ and lower than GND without imposing any reliability issues, the clock signal phases $\varphi_1$, $\varphi_2$, $\varphi_3$, $\varphi_4$, $\varphi_5$, and $\varphi_6$ are controlled.

In a first example, a transition from $-V_{DD}$ to $2*V_{DD}$ uses $\varphi_5<\varphi_4<\varphi_2<\varphi_1$ (first $\varphi_5$, last $\varphi_1$).

In a second example, a transition from $2*V_{DD}$ to $V_{DD}$ uses $\varphi_1<\varphi_3<\varphi_2$.

In a third example, a transition from $V_{DD}$ to $-V_{DD}$ uses $\varphi_3<\varphi_4<\varphi_5$.

When these timing sequencing rules (priority rules) are applied to the clock phases, all transistor's voltage differences (gate-to-source voltage or Vgs, gate-to-drain voltage or Vgd, and gate-to-drain voltage or Vds) are always below $V_{DD}$.

The illustrated embodiment provides a low voltage of $-V_{DD}$. In another embodiment, even lower voltage (for instance, $-2*V_{DD}$) is achieved by inserting another switch that is controlled by another control signal.

Figure 5A:
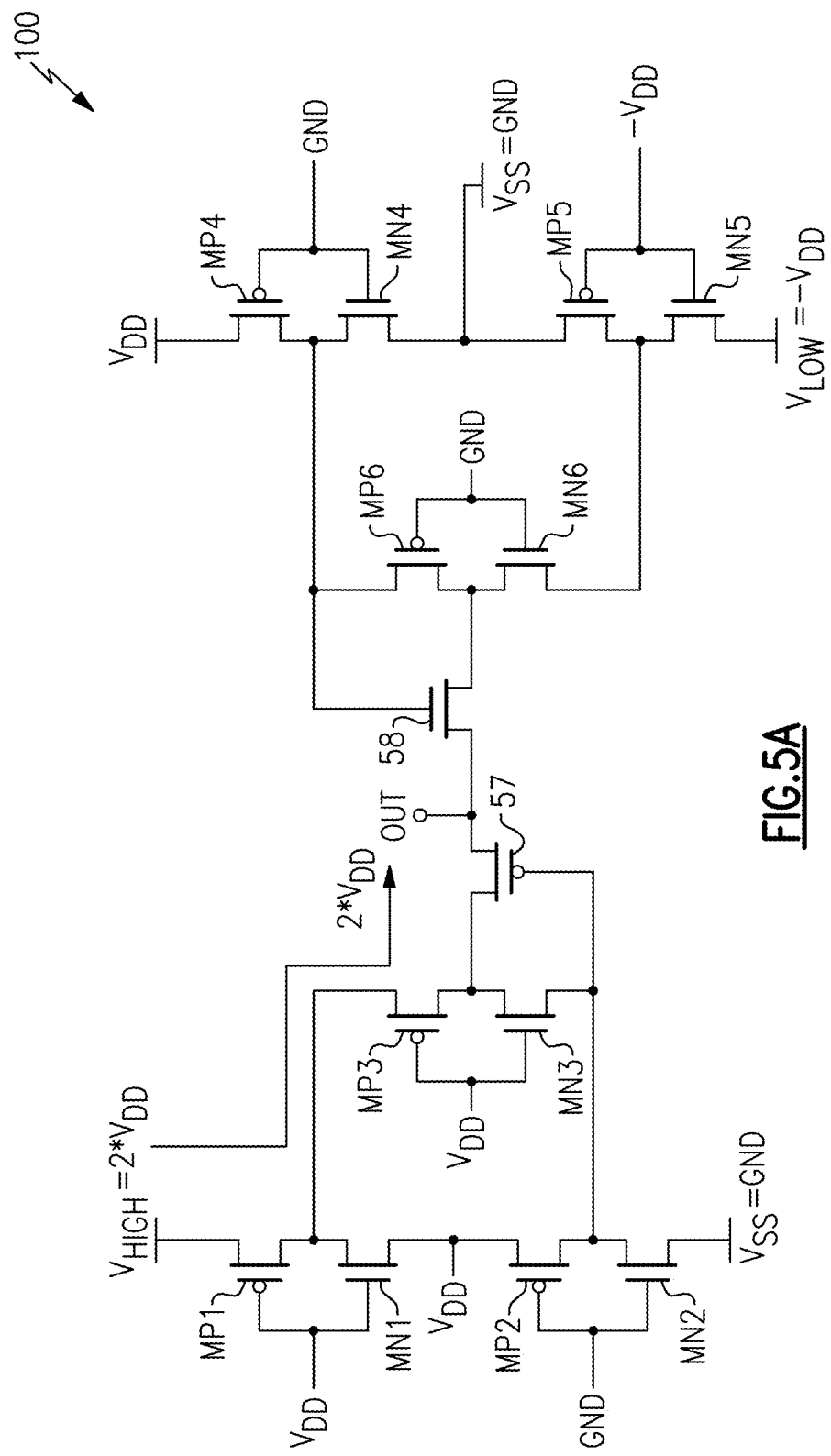
FIG. 5A is a schematic diagram of the multi-level buffer of FIG. 4A in a first operating state.

FIG. 5A is a schematic diagram of the multi-level buffer 100 of FIG. 4A in a first operating state in which the output voltage is $2*V_{DD}$.

As shown in FIG. 5A, to achieve the output voltage of $2*V_{DD}$, $\varphi_1'=V_{DD}$, $\varphi_2=$GND, $\varphi_3=V_{DD}$, $\varphi_4=$GND, $\varphi_5'=-V_{DD}$, and $\varphi_6=$GND.

Figure 5B:
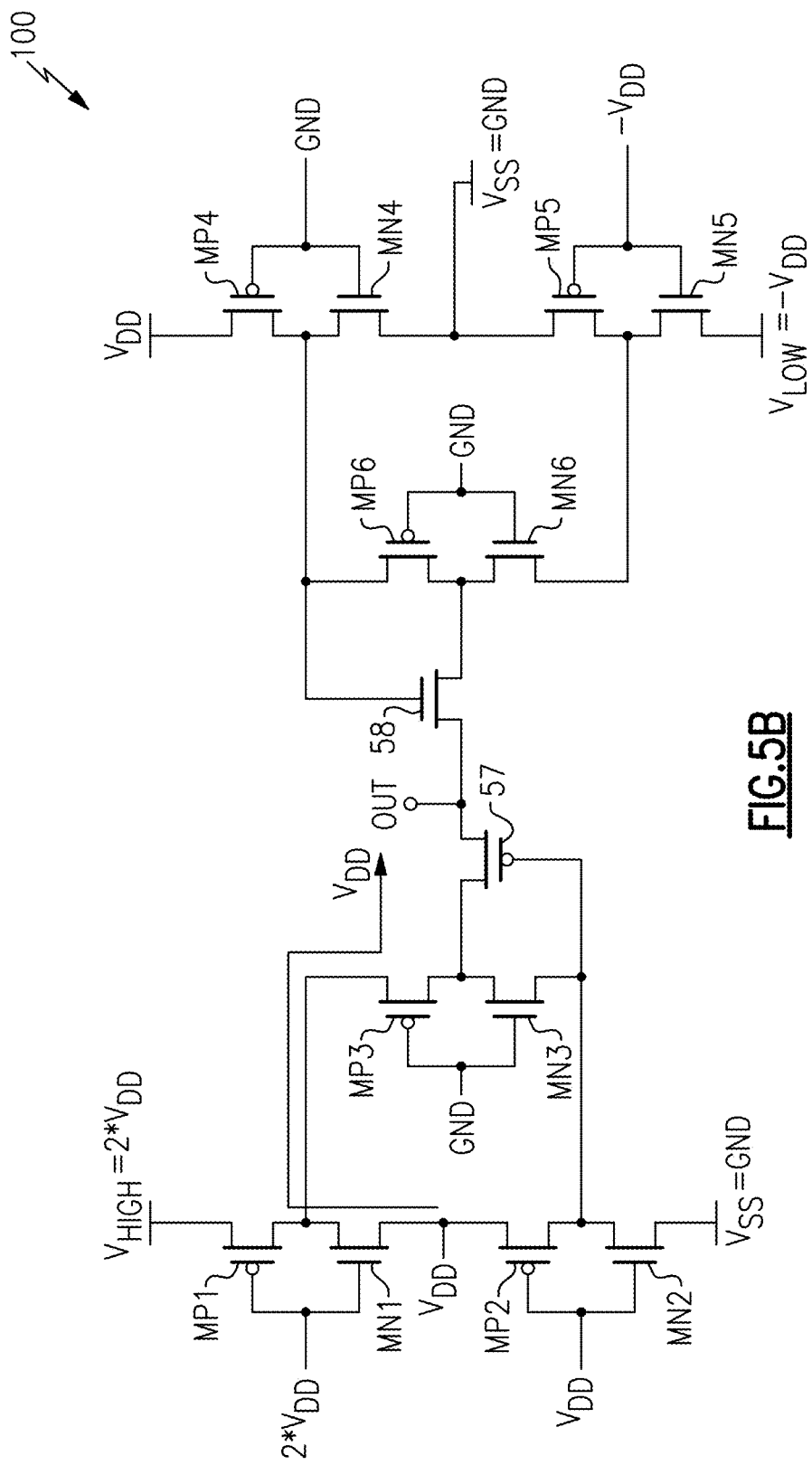
FIG. 5B is a schematic diagram of the multi-level buffer of FIG. 4A in a second operating state.

FIG. 5B is a schematic diagram of the multi-level buffer 100 of FIG. 4A in a second operating state in which the output voltage is $V_{DD}$.

As shown in FIG. 5B, to achieve the output voltage of $V_{DD}$, $\varphi_1'=2*V_{DD}$, $\varphi_2=V_{DD}$, $\varphi_3=GND$, $\varphi_4=GND$, $\varphi_5'=-V_{DD}$, and $\varphi_6=GND$.

Figure 5C:
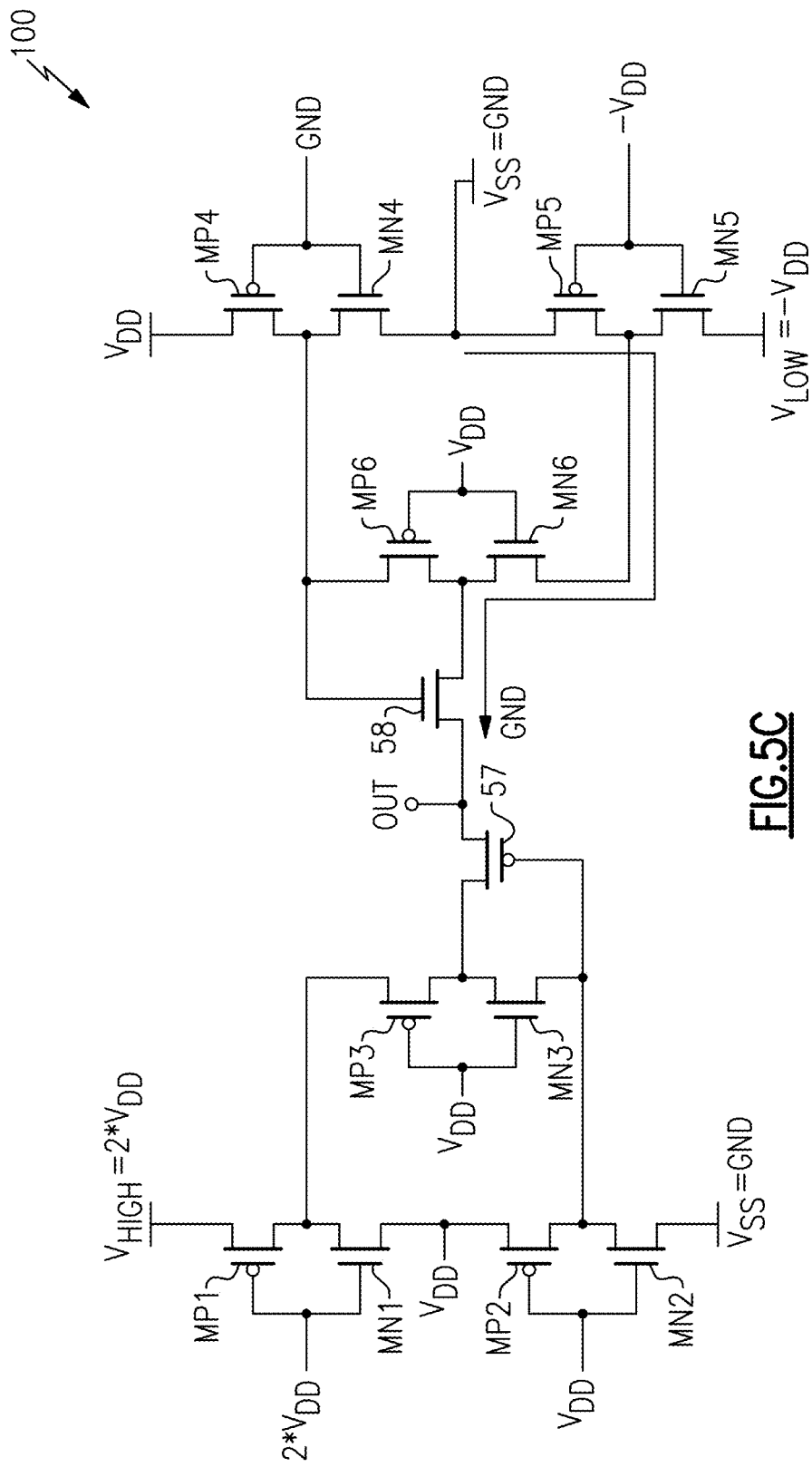
FIG. 5C is a schematic diagram of the multi-level buffer of FIG. 4A in a third operating state.

FIG. 5C is a schematic diagram of the multi-level buffer 100 of FIG. 4A in a third operating state in which the output voltage is GND.

As shown in FIG. 5C, to achieve the output voltage of GND, $\varphi_1'=2*V_{DD}$, $\varphi_2=V_{DD}$, $\varphi_3=V_{DD}$, $\varphi_4=GND$, $\varphi_5'=-V_{DD}$, and $\varphi_6=V_{DD}$.

Figure 5D:
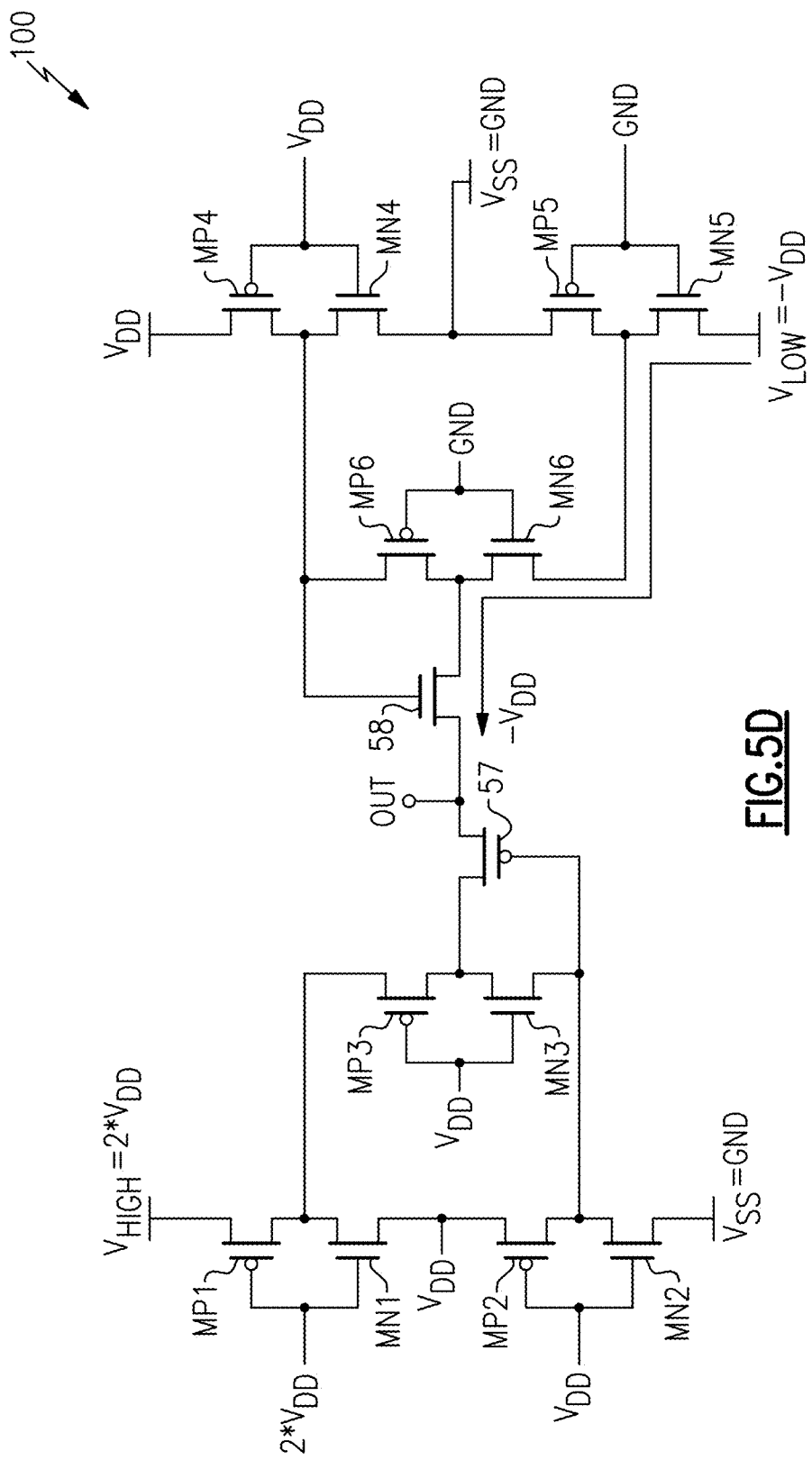
FIG. 5D is a schematic diagram of the multi-level buffer of FIG. 4A in a fourth operating state.

FIG. 5D is a schematic diagram of the multi-level buffer 100 of FIG. 4A in a fourth operating state in which the output voltage is $-V_{DD}$.

As shown in FIG. 5D, to achieve the output voltage of $-V_{DD}$, $\varphi_1'=2*V_{DD}$, $\varphi_2=V_{DD}$, $\varphi_3=V_{DD}$, $\varphi_4=V_{DD}$, $\varphi_5'=GND$, and $\varphi_6=GND$.

Figure 6:
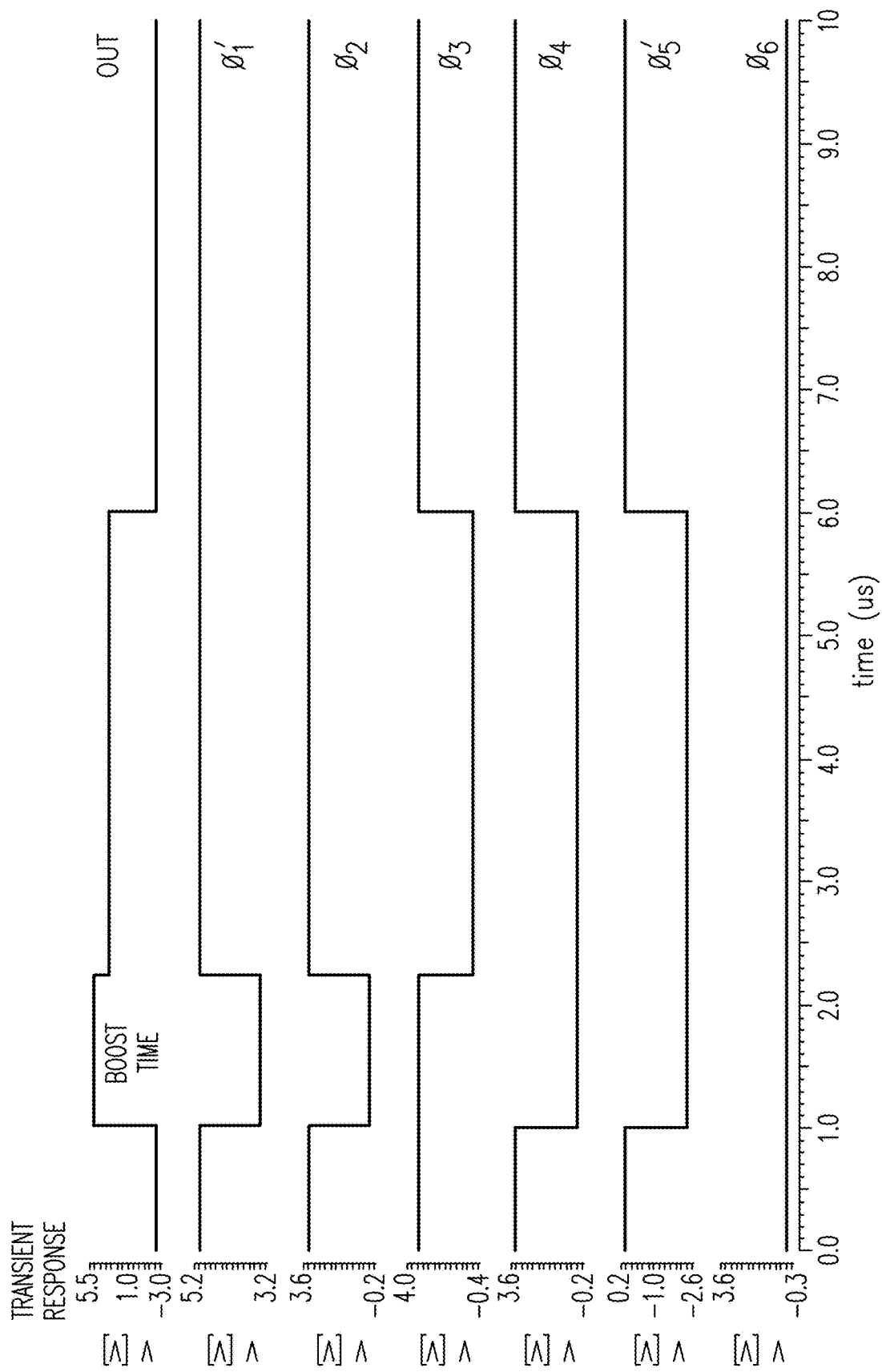
FIG. 6 is a timing diagram for a multi-level buffer according to one embodiment.

FIG. 6 is a timing diagram for a multi-level buffer according to one embodiment. The timing diagram depicts various clock signal phases for generating a boosted pulse for driving an RF switch. In particular, example voltages for OUT, $\varphi_1'$, $\varphi_2$, $\varphi_3$, $\varphi_4$, $\varphi_5'$, and $\varphi_6$ are shown. In this particular simulation, OUT is controlled to only three different voltage levels rather that four.

Figure 7:
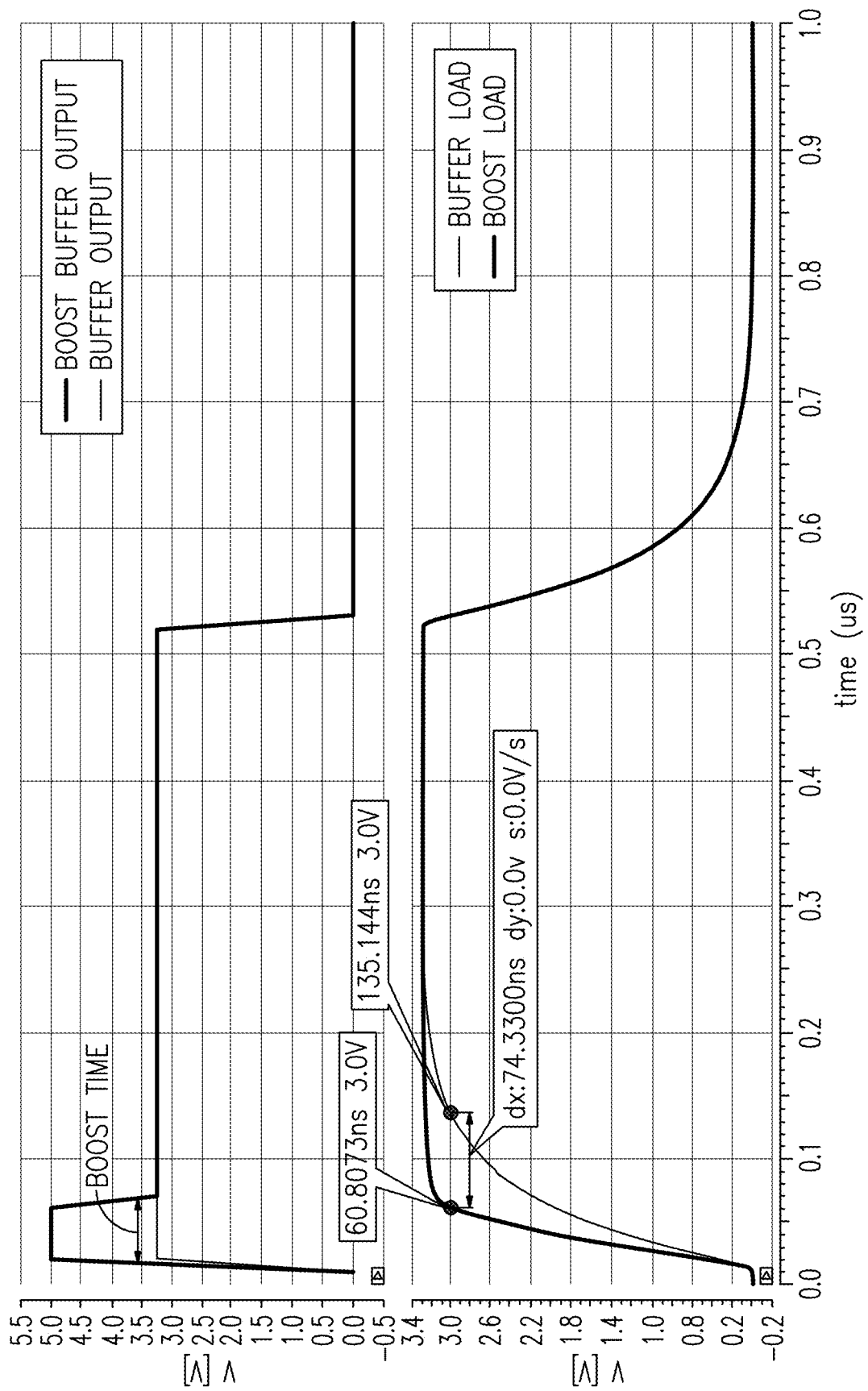
FIG. 7 is a timing diagram for an RF switching circuit according to one embodiment.

FIG. 7 is a timing diagram for an RF switching circuit according to one embodiment. The timing diagram compares gate voltage at an RF switch when using boosting relative to when not using boosting. As shown in FIG. 7, faster turn-on time is achieved when using boosting.

Applications

Devices employing the above described schemes can be implemented into various electronic devices. Examples of electronic devices include, but are not limited to, RF communication systems, consumer electronic products, electronic test equipment, communication infrastructure, etc. For instance, RF switches with fast switching can be used in a wide range of RF communication systems, including, but not limited to, base stations, mobile devices (for instance, smartphones or handsets), laptop computers, tablets, Internet of Things (IoT) devices, and/or wearable electronics. The teachings herein are applicable to RF communication systems operating over a wide range of frequencies and bands, including those using time division duplexing (TDD) and/or frequency division duplexing (FDD).

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radio frequency (RF) switching circuit comprising:
a field-effect transistor (FET) switch including a gate;
an impedance; and
a multi-level buffer having an output terminal connected to the gate of the FET through the impedance, wherein the multi-level buffer comprises a first inverter configured to receive a first clock signal phase and powered by a first supply voltage and a second supply voltage less than the first supply voltage, a second inverter configured to receive a second clock signal phase and powered by the second supply voltage and a third supply voltage less than the second supply voltage, a third inverter configured to receive a third clock signal phase and powered by an output of the first inverter and an output of the second inverter, and a first output switch connected between the output terminal and an output of the third inverter.

2. The RF switching circuit of claim 1, wherein the multi-level buffer is configured to generate a turn-on pulse of the switch control voltage in response to a transition of a control signal from an off state to an on state.

3. The RF switching circuit of claim 2, wherein the multi-level buffer is configured to generate the turn-on pulse by controlling the switch control voltage with the first supply voltage for a duration of the turn-on pulse, and thereafter to a steady-state on voltage by controlling the switch control voltage with the second supply voltage.

4. The RF switching circuit of claim 1, wherein the first output switch is a p-type FET having a gate controlled by the output of the second inverter.

5. The RF switching circuit of claim 1, wherein the multi-level buffer further comprises a fourth inverter configured to receive a fourth clock signal phase and powered by the second supply voltage and the third supply voltage, and a second output switch connected to the output terminal and controlled by an output of the fourth inverter.

6. The RF switching circuit of claim 5, wherein the multi-level buffer further comprises a fifth inverter configured to receive a fifth clock signal phase and powered by the third supply voltage and a fourth supply voltage less than the third supply voltage, and a sixth inverter configured to receive a sixth clock signal phase and powered by the output of the fourth inverter and an output of the fifth inverter, wherein an output of the sixth inverter is connected to the output terminal through the second output switch.

7. The RF switching circuit of claim 6, wherein the second output switch is an n-type FET having a gate controlled by the output of the fourth inverter.

8. The RF switching circuit of claim 6, wherein the multi-level buffer is configured to generate a turn-off pulse of the switch control voltage in response to a transition of the control signal from the on state to the off state.

9. The RF switching circuit of claim 8, wherein the multi-level buffer is configured to generate the turn-off pulse by controlling the switch control voltage with the fourth supply voltage for a duration of the turn-off pulse, and thereafter to a steady-state off voltage by controlling the switch control voltage with the third supply voltage.

10. The RF switching circuit of claim 6, wherein the multi-level driver further comprises a first level-shifter configured to drive an input of the first inverter and a second level-shifter configured to drive an input of the fifth inverter.

11. The RF switching circuit of claim 1, wherein the first inverter, the second inverter, the third inverter, and the first output switch are implemented using a plurality of FETs.

12. The RF switching circuit of claim 11, wherein a voltage difference between the first supply voltage and the third supply voltage exceeds a voltage rating of the plurality of transistors.

13. The RF switching circuit of claim 1, wherein the FET switch is an n-type metal oxide semiconductor (NMOS) switch or a p-type metal oxide semiconductor (PMOS) switch.

14. The RF switching circuit of claim 1, wherein the impedance comprises a gate resistor.

15. The RF switching circuit of claim 1, wherein the multi-level driver further comprising a timing circuit configured to receive a control signal, and to generate a plurality of clock signal phases including the first clock signal phase, the second clock signal phase, and the third clock signal phase.

16. A multi-level buffer for driving a transistor gate, the multi-level buffer comprising:
   an output terminal;
   a first inverter configured to receive a first clock signal phase and powered by a first supply voltage and a second supply voltage less than the first supply voltage;
   a second inverter configured to receive a second clock signal phase and powered by the second supply voltage and a third supply voltage less than the second supply voltage;
   a third inverter configured to receive a third clock signal phase and powered by an output of the first inverter and an output of the second inverter; and
   a first output switch connected between the output terminal and an output of the third inverter.

17. The multi-level buffer of claim 16, wherein the first output switch is a p-type FET having a gate controlled by the output of the second inverter.

18. The multi-level buffer of claim 16, wherein the multi-level buffer further comprises a fourth inverter configured to receive a fourth clock signal phase and powered by the second supply voltage and the third supply voltage, and a second output switch connected to the output terminal and controlled by an output of the fourth inverter.

19. The multi-level buffer of claim 16, wherein the multi-level buffer further comprises a fifth inverter configured to receive a fifth clock signal phase and powered by the third supply voltage and a fourth supply voltage less than the third supply voltage, and a sixth inverter configured to receive a sixth clock signal phase and powered by the output of the fourth inverter and an output of the fifth inverter, wherein an output of the sixth inverter is connected to the output terminal through the second output switch.

20. A method of radio frequency (RF) switching, the method comprising:
   providing a first clock signal phase to an input of a first inverter that is powered by a first supply voltage and a second supply voltage less than the first supply voltage;
   providing a second clock signal phase to an input of a second inverter that is powered by the second supply voltage and a third supply voltage less than the second supply voltage;
   providing a third clock signal phase to an input of a third inverter that is powered by an output of the first inverter and an output of the second inverter;
   controlling an output voltage at an output terminal using a first output switch connected between the output terminal and an output of the third inverter; and
   providing the output voltage to a gate of a field-effect transistor (FET) switch through an impedance.

* * * * *